(12) United States Patent
Sundararajan et al.

(10) Patent No.: US 12,032,840 B2
(45) Date of Patent: Jul. 9, 2024

(54) SYSTEM LEVEL HARDWARE MECHANISMS FOR DYNAMIC ASSIST CONTROL

(71) Applicant: NVIDIA CORPORATION, Santa Clara, CA (US)

(72) Inventors: Anand Shanmugam Sundararajan, Chennai (IN); Narayan Kulshrestha, Fremont, CA (US); Ka Yun Lee, Cupertino, CA (US); Brian Smith, Mountain View, CA (US); Madhukiran V. Swarna, Portland, OR (US); Ramachandiran V, Bangalore (IN); Kevin Wilder, Wilmette, IL (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 17/678,784

(22) Filed: Feb. 23, 2022

(65) Prior Publication Data

US 2023/0266899 A1    Aug. 24, 2023

(51) Int. Cl.
*G06F 3/06* (2006.01)

(52) U.S. Cl.
CPC .......... *G06F 3/0634* (2013.01); *G06F 3/0625* (2013.01); *G06F 3/0653* (2013.01); *G06F 3/0673* (2013.01)

(58) Field of Classification Search
CPC .... G06F 3/0634; G06F 3/0653; G06F 3/0625; G06F 3/0673; G06F 3/06; G06F 3/0675
See application file for complete search history.

(56) References Cited

U.S. PATENT DOCUMENTS

| | | | |
|---|---|---|---|
| 9,154,079 B2 * | 10/2015 | Zhuo | H03D 7/12 |
| 11,763,906 B2 * | 9/2023 | Merritt | G11C 29/46 |
| | | | 711/103 |

(Continued)

FOREIGN PATENT DOCUMENTS

| | | | | |
|---|---|---|---|---|
| EP | 3061409 A1 * | 8/2016 | ........... | A61B 17/068 |
| WO | WO-2018071101 A1 * | 4/2018 | ............. | G06F 1/206 |

OTHER PUBLICATIONS

A. Calimera, A. Macii, E. Macii and M. Poncino, "Design Techniques and Architectures for Low-Leakage SRAMs," in IEEE Transactions on Circuits and Systems I: Regular Papers, vol. 59, No. 9, pp. 1992-2007, Sep. 2012.*

(Continued)

*Primary Examiner* — Pierre Michel Bataille
(74) *Attorney, Agent, or Firm* — Squire Patton Boggs LLP; Sarah Mirza

(57) ABSTRACT

Various embodiments include a computer memory system that dynamically adjusts a memory device performance feature, such as dynamic assist control, dynamic turbo mode, and/or the like, to improve the performance of memory devices in the memory system. The memory system enables or disables the memory device performance feature based on the operating voltage relative to a threshold voltage. If the operating voltage crosses the threshold voltage in one direction, then the memory device system enables the memory device performance feature. If the operating voltage crosses the threshold voltage in another direction, then the memory system disables the memory device performance feature. Various techniques enable the memory device performance feature to be employed even with complex integrated circuits that may include tens of thousands of devices that employ the memory device performance feature.

20 Claims, 10 Drawing Sheets

(56) References Cited

U.S. PATENT DOCUMENTS

| | | | | |
|---|---|---|---|---|
| 2011/0026335 A1* | 2/2011 | Kwon | ................. | G11C 7/20 |
| | | | | 365/189.11 |
| 2012/0131278 A1* | 5/2012 | Chang | ................. | G06F 1/3268 |
| | | | | 711/E12.017 |
| 2012/0134213 A1* | 5/2012 | Choi | ................. | G11C 16/10 |
| | | | | 365/185.18 |
| 2014/0143577 A1* | 5/2014 | Nachimuthu | ......... | G06F 3/0685 |
| | | | | 713/324 |
| 2014/0149763 A1* | 5/2014 | Allen-Ware | ......... | G06F 1/3296 |
| | | | | 713/320 |
| 2016/0118130 A1* | 4/2016 | Chadha | ............ | G11C 16/225 |
| | | | | 365/185.18 |
| 2018/0101204 A1* | 4/2018 | Fackenthal | ........... | G06F 3/0679 |
| 2021/0153302 A1* | 5/2021 | Wieckowski | ........... | F24H 1/202 |
| 2021/0202018 A1* | 7/2021 | Hirst | ................. | G11C 16/34 |
| 2022/0108755 A1* | 4/2022 | Hartz | ................. | G11C 16/10 |
| 2022/0170963 A1* | 6/2022 | Peng | ................. | H03F 3/45188 |
| 2022/0188208 A1* | 6/2022 | Gutierrez | ........... | G06F 12/0815 |
| 2022/0199142 A1* | 6/2022 | Mathiyalagan | ...... | G11C 29/021 |
| 2023/0139638 A1* | 5/2023 | Wu | ................. | G06F 1/26 |
| | | | | 365/226 |

OTHER PUBLICATIONS

A. Balachandran, "Low power and area efficient Static Random Access Memory design using schmitt trigger," 2013 International Conference on Information Communication and Embedded Systems (ICICES), Chennai, India, 2013, pp. 1183-1187.*

M. E. Sinangil, N. Verma and A. P. Chandrakasan, "A Reconfigurable 8T Ultra-Dynamic Voltage Scalable (U-DVS) SRAM in 65 nm CMOS," in IEEE Journal of Solid-State Circuits, vol. 44, No. 11, pp. 3163-3173, Nov. 2009.*

D. R. Moore and A. G. Dean, "Intra-operation Dynamic Voltage Scaling," 2015 IEEE 3rd International Conference on Cyber-Physical Systems, Networks, and Applications, Hong Kong, China, 2015, pp. 70-77.*

Joe Brewer; Manzur Gill, "Memory Circuit Technologies," in Nonvolatile Memory Technologies with Emphasis on Flash: A Comprehensive Guide to Understanding and Using Flash Memory Devices , IEEE, 2008, pp. 63-128.*

Anantha Chandrakasan; Robert W. Brodersen, "DRAM," in Low-Power CMOS Design , IEEE, 1998, pp. 318-351.*

* cited by examiner

SYSTEM LEVEL HARDWARE MECHANISMS FOR DYNAMIC ASSIST CONTROL

BACKGROUND

Field of the Various Embodiments

Various embodiments relate generally to computer memory systems and, more specifically, to system level hardware mechanisms for dynamic assist control.

Description of the Related Art

A computer system generally includes, among other things, one or more processing units, such as central processing units (CPUs) and/or graphics processing units (CPUs), and one or more memory systems. One type of memory system is referred to as system memory, which is accessible to both the CPU(s) and the GPU(s). Another type of memory system is graphics memory, which is typically accessible only by the GPU(s). These memory systems comprise multiple memory devices. One example memory device employed in system memory and/or graphics memory is static random access memory (SRAM).

As integrated circuit technology improves, the size of features and components on CPU(s), GPU(s), and memory devices decreases, resulting in various benefits, such as smaller, more power-efficient components and improved device performance. Integrated circuits are identified by process nodes, where a process node indicates a semiconductor manufacturing process and design rules employed to manufacture various devices. In general, the smaller the process node, the smaller the features on the integrated circuit, leading to smaller, faster, and more power-efficient components. For example, a 5 nanometer (nm) process node results in smaller, faster and more power-efficient components relative to a 16 nm process node. Similarly, a 3 nm process node results in smaller, faster and more power-efficient components relative to either a 5 nm process node or a 16 nm process node, and so on.

One disadvantage of smaller process nodes is that the operating voltage range is reduced as the process node decreases. This effect is pronounced for memory devices such as SRAM memory devices. For example, consider a device manufactured according to a 16 nm process node that operates between a minimum voltage (Vmin) and a maximum voltage (Vmax). Decreasing the operating voltage towards Vmin decreases power consumption at the cost of lower performance, while increasing the operating voltage towards Vmax increases performance at the cost of increasing power consumption. A corresponding device manufactured according to a 5 nm process node may have an operating voltage range that has essentially the same Vmax level but a higher Vmin level. As a result, the operating voltage of a 5 nm device cannot be reduced as much as a corresponding operating voltage of a 16 nm device, resulting in higher power consumption.

One solution to this problem is to employ SRAM assist technology, which includes read assist, for assisting read operations, and write assist, for assisting write operations. SRAM assist technology allows the operating voltage to be reduced to a Vmin level that is lower than the Vmin for a device without SRAM assist control technology. A device with SRAM assist technology, thereby, can operate with lower power consumption relative to a corresponding device without SRAM assist technology. However, one drawback to SRAM assist technology is that Vmax for a device that enables SRAM assist technology may also be reduced, resulting in a lower maximum performance for a device with SRAM assist technology relative to a corresponding device without SRAM assist technology.

As the foregoing illustrates, what is needed in the art are more effective techniques for improving the operating voltage range of integrated circuits at smaller process nodes.

SUMMARY

Various embodiments of the present disclosure set forth a computer-implemented method for controlling a memory device performance feature. The method includes determining that an operating voltage has crossed a first threshold voltage in a first direction. The method further includes, in response, enabling the memory device performance feature for a first memory device. The method further includes determining that the operating voltage has crossed a second threshold voltage in a second direction. The method further includes, in response, disabling the memory device performance feature for the first memory device.

Other embodiments include, without limitation, a system that implements one or more aspects of the disclosed techniques, and one or more computer readable media including instructions for performing one or more aspects of the disclosed techniques.

At least one technical advantage of the disclosed techniques relative to the prior art is that, with the disclosed techniques, SRAM memory devices have a larger operating voltage range relative to devices with static assist. By enabling dynamic assist control at lower operating voltages, Vmin is reduced, thereby decreasing the minimum power consumption. By disabling dynamic assist control at higher operating voltages, Vmax is increased, thereby increasing the maximum performance. Another technical advantage of the disclosed techniques is that the control mechanism deployed for dynamic assist control can additionally or alternatively be employed for other memory performance features, thereby enabling dynamic control for turbo mode and/or other performance features. These technical advantages represent one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
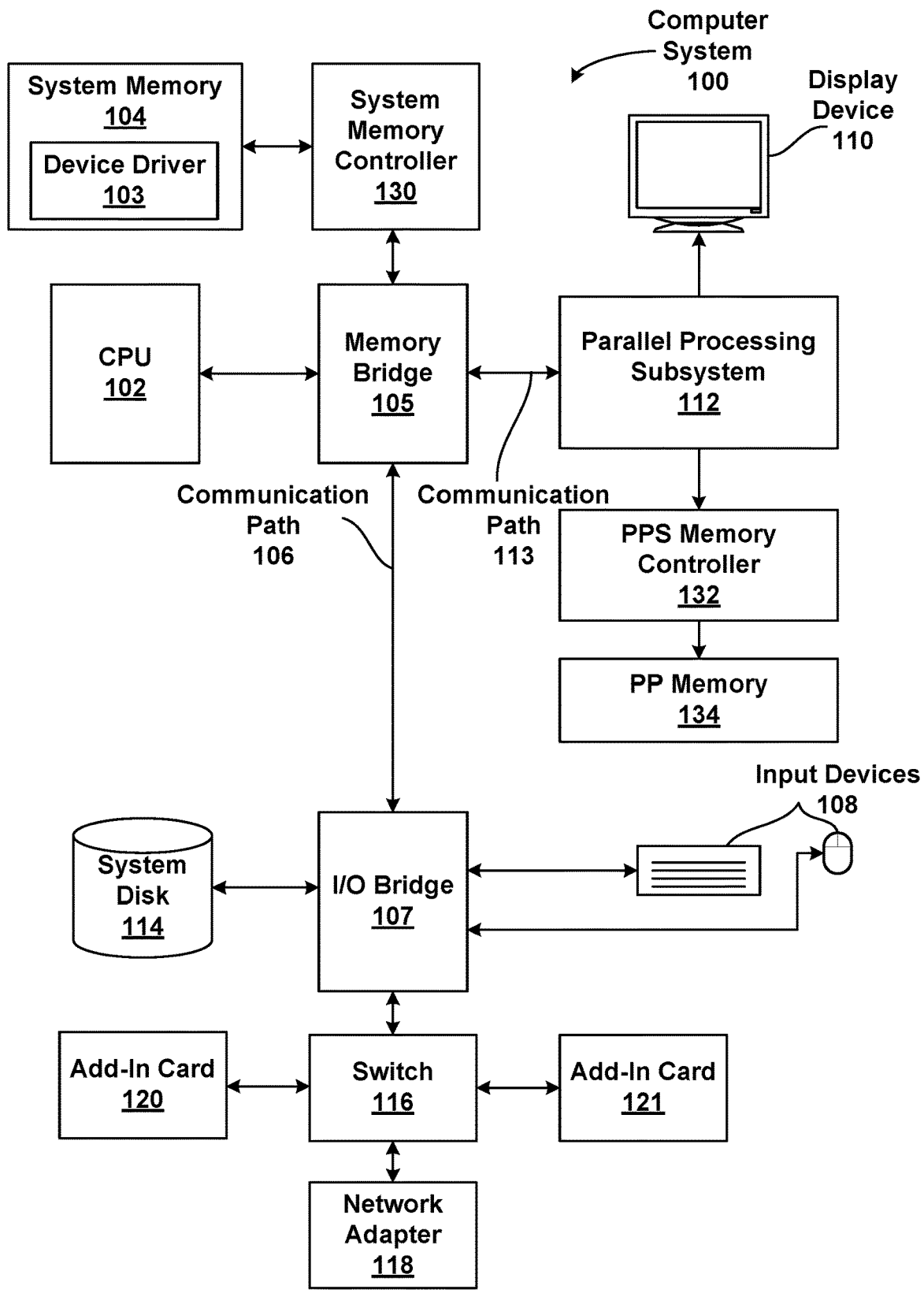
FIG. 1 is a block diagram of a computer system configured to implement one or more aspects of the various embodiments.

FIG. 1 is a block diagram of a computer system 100 configured to implement one or more aspects of the various embodiments. As shown, computer system 100 includes, without limitation, a central processing unit (CPU) 102 and a system memory 104 coupled to a parallel processing subsystem 112 via a memory bridge 105 and a communication path 113. Memory bridge 105 is coupled to system memory 104 via a system memory controller 130. Memory bridge 105 is further coupled to an I/O (input/output) bridge 107 via a communication path 106, and I/O bridge 107 is, in turn, coupled to a switch 116. Parallel processing subsystem 112 is coupled to parallel processing memory 134 via a parallel processing subsystem (PPS) memory controller 132.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high-definition DVD), or other magnetic, optical, or solid-state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, and/or the like. In such embodiments, parallel processing subsystem 112 incorporates circuitry optimized for graphics and video processing, including, for example, video output circuitry. Such circuitry may be incorporated across one or more parallel processing units (PPUs) included within parallel processing subsystem 112. In some embodiments, each PUPS comprises a graphics processing unit (GPU) that may be configured to implement a graphics rendering pipeline to perform various operations related to generating pixel data based on graphics data supplied by CPU 102 and/or system memory 104. Each PPU may be implemented using one or more integrated circuit devices, such as programmable processors, application specific integrated circuits (ASICs), or memory devices, or in any other technically feasible fashion In some embodiments, parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more other elements of FIG. 1 to form a single system. For example, parallel processing subsystem 112 may be integrated with CPU 102 and other connection circuitry on a single chip to form a system on chip (SoC).

In operation, CPU 102 is the master processor of computer system 100, controlling and coordinating operations of other system components. In particular, CPU 102 issues commands that control the operation of PPUs within parallel processing subsystem 112. In some embodiments, CPU 102 writes a stream of commands for PPUs within parallel processing subsystem 112 to a data structure (not explicitly shown in FIG. 1) that may be located in system memory 104, PP memory 134, or another storage location accessible to both CPU 102 and PPUs. A pointer to the data structure is written to a pushbuffer to initiate processing of the stream of commands in the data structure. The PPU reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

Each PPU includes an I/O (input/output) unit that communicates with the rest of computer system 100 via the communication path 113 and memory bridge 105. This I/O unit generates packets (or other signals) for transmission on communication path 113 and also receives all incoming packets (or other signals) from communication path 113, directing the incoming packets to appropriate components of the PPU. The connection of PPUs to the rest of computer system 100 may be varied. In some embodiments, parallel processing subsystem 112, which includes at least one PPU, is implemented as an add-in card that can be inserted into an expansion slot of computer system 100. In other embodiments, the PPUs can be integrated on a single chip with a bus bridge, such as memory bridge 105 or I/O bridge 107. Again, in still other embodiments, some or all of the elements of the PPUs may be included along with CPU 102 in a single integrated circuit or system on chip (SoC).

CPU 102 and PPUs within parallel processing subsystem 112 access system memory via a system memory controller 130. System memory controller 130 transmits signals to the memory devices included in system memory 104 to initiate the memory devices, transmit commands to the memory devices, write data to the memory devices, read data from the memory devices, and/or the like. One example memory device employed in system memory 104 is double-data rate SDRAM (DDR SDRAM or, more succinctly, DDR). DDR memory devices perform memory write and read operations at twice the data rate of previous generation single data rate (SDR) memory devices.

In addition, PPUs and/or other components within parallel processing subsystem 112 access PP memory 134 via a parallel processing system (PPS) memory controller 132. PPS memory controller 132 transmits signals to the memory devices included in PP memory 134 to initiate the memory devices, transmit commands to the memory devices, write data to the memory devices, read data from the memory devices, and/or the like. One example memory device employed in PP memory 134 synchronous graphics random access memory (SCRAM), which is a specialized form of SDRAM for computer graphics applications. One particular type of SCRAM is graphics double-data rate SCRAM (GDDR SDRAM or, more succinctly, GDDR). Compared with DDR memory devices, GDDR memory devices are configured with a wider data bus, in order to transfer more data bits with each memory write and read operation. By employing double data rate technology and a wider data bus, GDDR memory devices are able to achieve the high data transfer rates typically needed by PPUs.

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

It will be appreciated that the core architecture described herein is illustrative and that variations and modifications are possible. Among other things, the computer system 100 of FIG. 1, may include any number of CPUs 102, parallel processing subsystems 112, or memory systems, such as system memory 104 and parallel processing memory 134, within the scope of the disclosed embodiments. Further, as used herein, references to shared memory may include any one or more technically feasible memories, including, without limitation, a local memory shared by one or more PPUs within parallel processing subsystem 112, memory shared between multiple parallel processing subsystems 112, a cache memory, parallel processing memory 134, and/or system memory 104. Please also note, as used herein, references to cache memory may include any one or more technically feasible memories, including, without limitation, an L1 cache, an L1.5 cache, and L2 caches. In view of the foregoing, persons of ordinary skill in the art will appreciate that the architecture described in FIG. 1 in no way limits the scope of the various embodiments of the present disclosure.

Dynamic Assist Control for Memory Devices

Various embodiments are directed to techniques for dynamically applying assist control for an integrated circuit, such as for SRAM memory devices. With the disclosed techniques, dynamic assist control is enabled or disabled based on the operating voltage relative to a threshold voltage. If the operating voltage falls below the threshold voltage, then dynamic assist control is enabled, which reduces the minimum operating voltage (Vmin) of the integrated circuit. If the operating voltage rises above the threshold voltage, then dynamic assist control is disabled, which increases the maximum operating voltage (Vmax) of the integrated circuit. Various techniques enable dynamic assist control to be employed even with complex integrated circuits that may include tens of thousands of devices that employ dynamic assist control technology.

Figure 2:
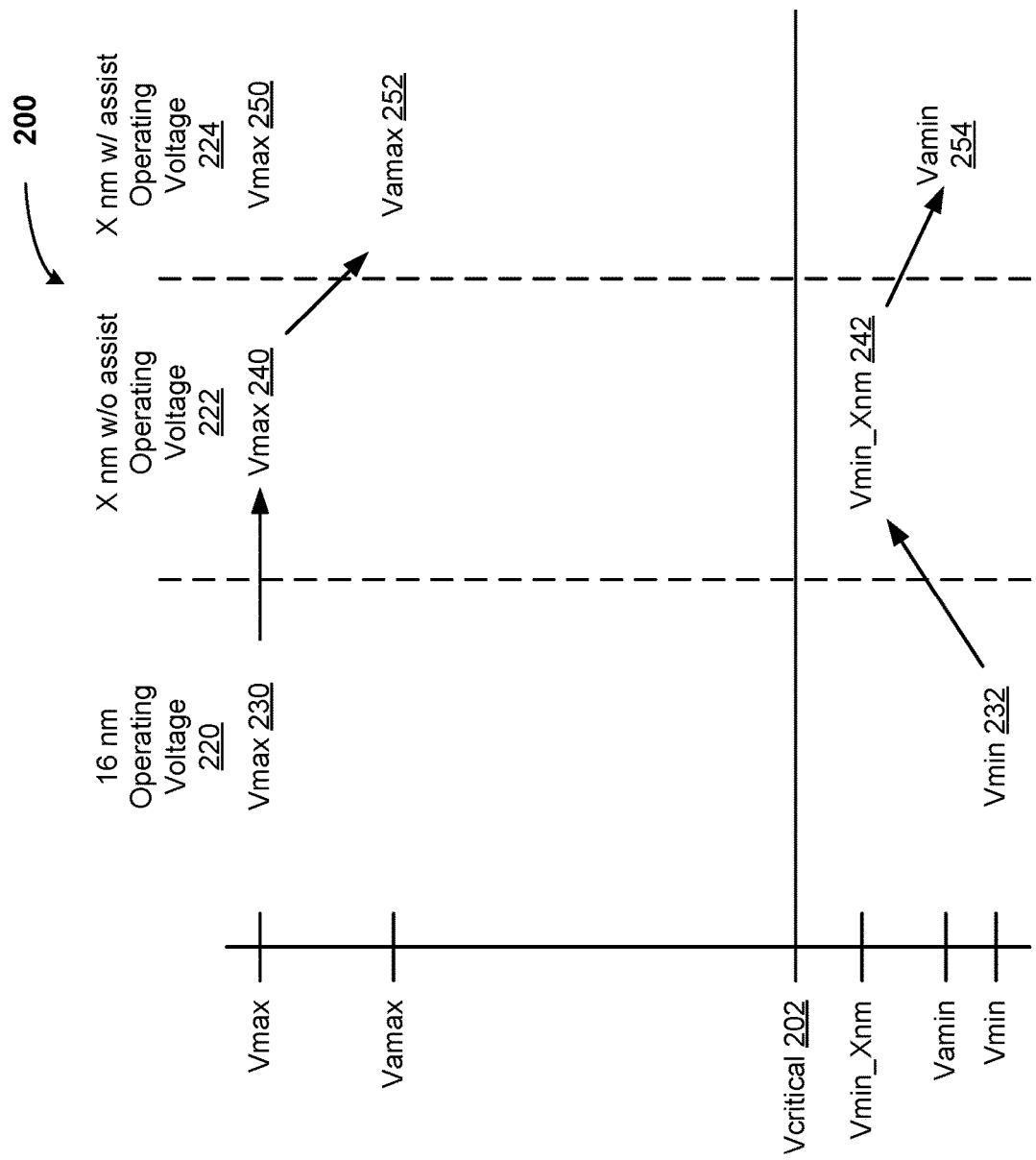
FIG. 2 illustrates operating voltage ranges for various memory devices included in system memory and/or parallel processing memory of the computer system of FIG. 1, according to various embodiments.

FIG. 2 illustrates operating voltage ranges for various memory devices included in system memory 104 and/or parallel processing memory 134 of the computer system 100 of FIG. 1, according to various embodiments. Additional or alternatively, the operating voltage ranges illustrated in FIG. 2, and the techniques described herein, can apply to any SRAM and/or other suitable memory device included in parallel processing subsystem 112, CPU 102, and/or other elements shown in FIG. 1, within the scope of the present disclosure. As shown, a memory device manufactured according to a 16 nm process node has an operating voltage 220 that ranges from a minimum of Vmin 232 to a maximum of Vmax 230. A similar memory device manufactured according to an X nm process node without dynamic assist control has an operating voltage 222 that ranges from a minimum of Vmin_Xnm 242 to a maximum of Vmax 240. "X" represents any process node that is smaller than 16 nm, including 5 nm, 3 nm, and/or the like. Vmax 230 for the 16 nm memory device and Vmax 240 for the X nm device are essentially the same. However, Vmin 232 for the 16 nm memory device is lower than Vmin_Xnm 242. In some examples, Vmin 232 for the 16 nm memory device can be approximately 100 millivolts (mV) lower than Vmin_Xnm 242. As a result, the 16 nm memory device can achieve lower power consumption at Vmin 232 than the X nm memory device can achieve at Vmin_Xnm 242.

To address this issue, a memory device is manufactured according to a X nm process node with dynamic assist control. The range of the operating voltage 224 for this device changes based on whether the operating voltage is below or above a threshold Vcritical 202. If the operating voltage is below Vcritical 202, then the memory device enables dynamic assist control. With dynamic assist control enabled, the memory device has minimum operating voltage of Vamin 254. Although Vamin 254 may be greater than Vmin 232 of the 16 nm memory device, Vamin 254 is less than Vmin_Xnm 242 of the X nm memory device without dynamic assist control. However, when dynamic assist control is enabled, the maximum operating voltage is reduced by the negative bit line voltage (NBL) to Vamax 252. Therefore, when the memory device determines that the operating voltage has risen above Vcritical 202, then the memory device disables dynamic assist control. With dynamic assist control disabled, the memory device has a maximum operating voltage of Vmax 250, where Vmax is equal to Vmax 240 of the X nm memory device without dynamic assist control. By dynamically enabling and disabling based on the operating voltage relative to Vcritical 202, the X nm device with dynamic assist control has an operating voltage 224 that ranges from a minimum of Vamin 254 to a maximum of Vmax 250.

Dynamic assist control has the benefit of a lower minimum operating voltage Vamin 254 available with dynamic assist control to a maximum of Vmax 250 similar to a memory device without dynamic assist control. Implementing dynamic assist control on large CPUs, GPUs, and SoCs, which may have tens of thousands of memory devices, presents certain challenges.

First, the dynamic assist control is distributed to various memory devices located in different regions of the system, is dynamically toggled between enable and disable states, and is distributed synchronously to various SRAM memory devices located in different regions of the system. More specifically, each SRAM memory device has a dynamic assist control input pin, where this input pin is a synchronous pin that is synchronized to the write clock of the respective memory device. The dynamic assist control is synchronously distributed across the die to the respective input pin for various memory devices that are operating on the same voltage rail. In some examples, a GPU may include more than 40,000 SRAM memory devices distributed over multiple clock domains. The dynamic assist control logic synchronously distributes the dynamic assist control signal across these SRAM memory devices in respective clock domains, such as the write clock domains of the various SRAM memory devices.

Second, the dynamic assist threshold voltage is not a fixed voltage. Instead, the dynamic assist threshold voltage is sensitive to changes in temperature and changes in voltage-frequency points. During operation, if there is a variation in operating temperature and/or voltage-frequency point, then the assist threshold voltage also changes. Therefore, the dynamic assist control logic is configured to react and adjust to changes in operating temperature and/or voltage-frequency point.

Third, certain SRAM idle features, such as clock gating, may prevent the assist control signal from being correctly propagated to one or more SRAM memory devices that are in an idle state. The dynamic assist control logic includes a handshaking mechanism to disable certain idle modes when the dynamic assist control is toggled. This allows for any change in the dynamic assist control to be propagated to various SRAM memory devices, including SRAM memory devices that are currently in an idle state. After the change in the assist control has been propagated, the relevant SRAM memory devices can return to the previous idle state.

Fourth, when the dynamic assist control toggles between the enabled and disabled states, the voltage-frequency (VF) curve changes for the SRAM memory device. More specifically, the SRAM memory device operates with two different VF curves—one VF curve that applies when dynamic assist control is disabled and another VF curve that applies when assist control is enabled. Thus, for a given voltage, if the dynamic assist control toggles from disabled to enabled, the operating frequency decreases. Correspondingly, if the assist control toggles from enabled to disabled, the operating frequency increases. This sudden change in operating frequency can cause the clock source that locks to the VF curve to become unstable. The clock source can be implemented with a noise-aware frequency locked loop (NAFLL), a phase-locked loop (PLL), and/or the like. The dynamic assist control logic includes a mechanism to handle fast clock source slowdown when performing a VF curve switch. This mechanism allows the clock source to properly lock to the new VF curve when the state of the assist control changes.

Fifth, the dynamic assist control should be implemented in hardware that is tamper resistant so that the assist control cannot be negatively impacted due to intentional external attacks or unintentional alteration due to errant hardware, software applications, and/or the like.

The disclosed embodiments overcome at least these challenges via various techniques. More particularly, the dynamic assist control logic includes a secure memory in the form of a temperature-controlled lookup table (LUT) that generates different values for the threshold voltage as the operating temperature changes. The temperature controlled LUT addresses the issue that the dynamic assist threshold voltage is not a fixed voltage. Further, the temperature controlled LUT is implemented in secure hardware with restricted access and can be initialized and updated by a trusted software application executing on a secure processor. However, the temperature controlled LUT is not accessible to untrusted software applications executing on an unsecure processor. Therefore, aberrant hardware, software applications, and/or the like cannot maliciously or unintentionally change the values in the temperature controlled LUT.

In addition, the dynamic assist control logic includes an assist generator that includes a hardware comparator based on an analog to digital convertor (ADC) or other logic for measuring voltage. The ADC samples the operating voltage observed on the voltage rail. The hardware comparator compares this operating voltage with the threshold voltage from the temperature controlled LUT to generate the dynamic assist control. The assist generator generates a dynamic assist control that can be distributed to various SRAM memory devices located in different regions of the system.

Further, the dynamic assist control logic includes hardware clock-gating logic that provides a handshake between the dynamic assist control and certain idle modes, such as clock gating. The hardware clock-gating logic ensures that various memory devices receive the dynamic assist control, including SRAM memory devices in an idle mode.

The dynamic assist control logic also includes a local dynamic assist control logic that is replicated for, and is located proximate to, each SRAM memory device or group of SRAM memory devices that employs dynamic assist control logic. Each instance of local dynamic assist control logic synchronizes the incoming dynamic assist control with the write clock domain for the corresponding SRAM memory device or group of SRAM memory devices. The local dynamic assist control logic is replicated for each write clock domain in order to synchronize the dynamic assist control for various SRAM memory devices across various write clock domains in the system.

Further, the dynamic assist control logic includes clock source control logic. The clock source control logic provides a fast clock source slowdown mechanism based on the dynamic assist control to assist the clock source in locking and/or switching to different VF curves when the dynamic assist control is toggled.

It will be appreciated that the techniques described herein are illustrative and that variations and modifications are possible. Among other things, the techniques are described herein in the context of dynamic assist control for memory devices, such as SRAM memory devices. However, the techniques and control mechanisms can be employed with other memory device performance features based on changes in voltage and/or temperature. One such performance feature, referred to herein as dynamic turbo mode, is a mechanism for increasing the speed of write access operations and/or read access operations. As described herein, dynamic assist control is enabled when the operating voltage falls below a voltage threshold and is disabled when the operating voltage rises above a voltage threshold. By contrast, dynamic turbo mode is enabled when the operating voltage rises above a voltage threshold and is disabled when the operating voltage falls below a voltage threshold. As with dynamic assist control, the rising voltage threshold and falling voltage threshold for dynamic turbo mode can be different from one another. This difference provides hysteresis that avoids rapid toggling of the turbo mode between the enable and disable states when the operating voltage is near the threshold voltage. In addition, as with dynamic assist control, the rising voltage threshold and falling voltage threshold for dynamic turbo mode can vary based on temperature. In some examples, a temperature-controlled lookup table (LUT) stores different values for the dynamic turbo mode threshold voltage as the operating temperature changes. These values are retrievable as the operating temperature changes.

In general, a particular die may employ dynamic assist control logic, dynamic turbo mode, and/or the like for all memory devices deployed on the die. Alternatively, certain types and/or implementations of memory cells on various memory devices on the die can benefit from dynamic assist control logic, dynamic turbo mode, and/or the like. Other types and/or implementations of memory cells on various memory devices on the die may not benefit from dynamic assist control logic, dynamic turbo mode, and/or the like. Therefore, a particular die may employ dynamic assist control logic, dynamic turbo mode, and/or the like for some memory devices, but not for other memory devices, distributed across the die.

Figure 3:
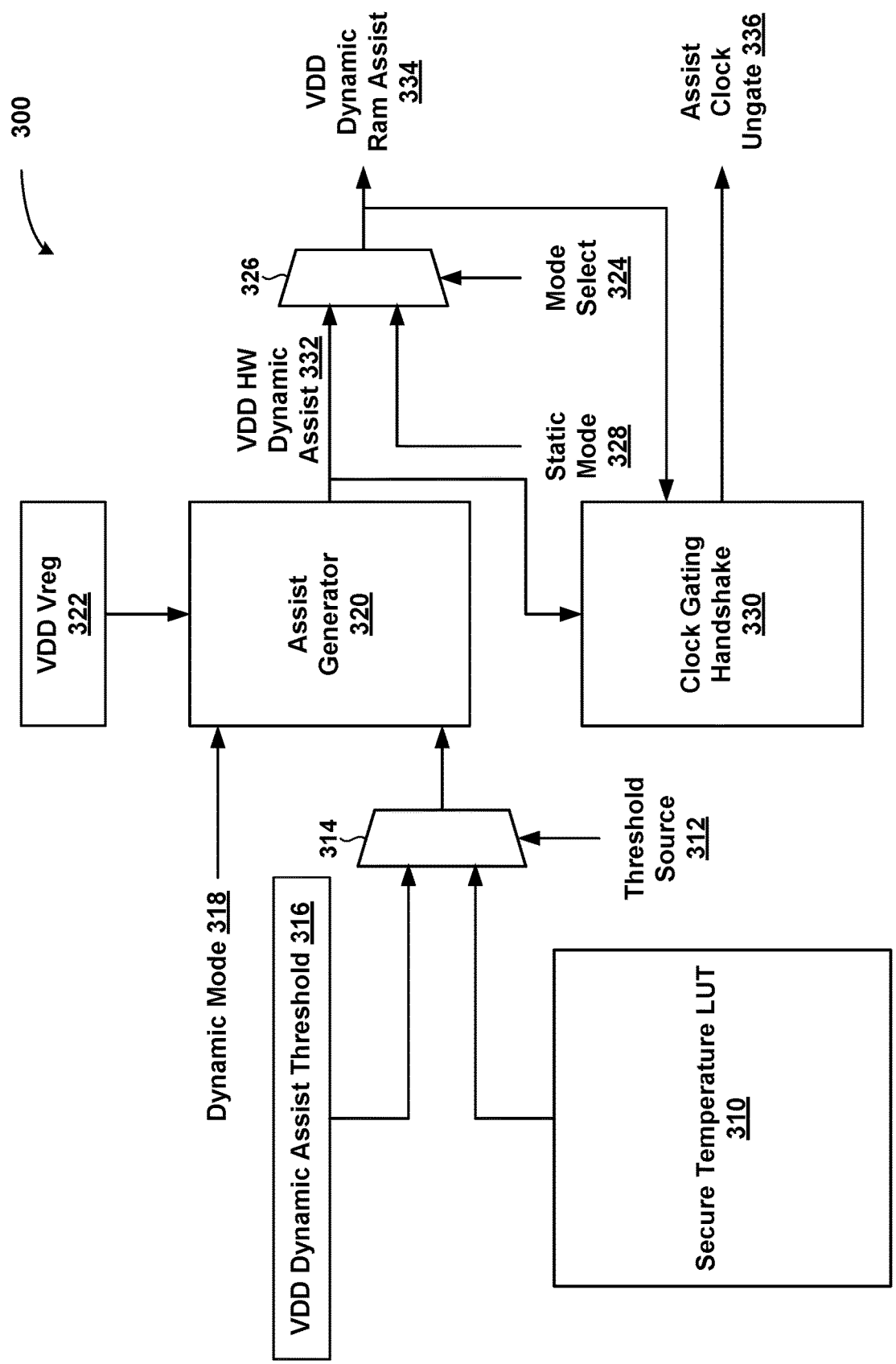
FIG. 3 is a block diagram of a dynamic assist control system for dynamic assist control for the computer system of FIG. 1, according to various embodiments.

FIG. 3 is a block diagram of a dynamic assist control system 300 for the computer system 100 of FIG. 1, according to various embodiments. As shown, the dynamic assist control system 300 includes, without limitation, a secure temperature LUT 310, an assist generator 320, and a clock gating handshake 330.

In operation, the secure temperature LUT 310 generates a digital value representing a temperature variable threshold voltage, where the threshold voltage changes as the operating temperature changes. The secure temperature LUT 310 transmits the digital value representing the temperature variable threshold voltage to a first input of a threshold source multiplexor 314. A supply voltage (VDD) dynamic assist threshold register 316 transmits a digital value representing a fixed threshold voltage to a second input of the threshold source multiplexor 314. A threshold source 312 control signal selects one of the inputs of the threshold source multiplexor 314 to transmit to the assist generator 320. In applications where the threshold voltage changes with the operating temperature, the threshold source 312 control signal selects the input corresponding to the output of the secure temperature LUT 310. In applications where the threshold voltage does not change with operating temperature, the threshold source 312 control signal selects the input corresponding to the output of the VDD dynamic assist threshold register 316. The threshold source multiplexor 314 transmits the digital value representing the selected threshold voltage to the assist generator 320.

In operation, the assist generator 320 generates the dynamic assist control for transmission to the SRAM memory devices. The assist generator 320 receives a dynamic mode 318 control signal that selects whether the assist generator 320 is operating with dynamic assist control or static assist. If the dynamic mode 318 control signal is asserted, then the assist generator 320 is operating with dynamic assist control. The assist generator 320 compares the operating voltage from the VDD voltage regulator (Vreg) 322 with the digital value representing the selected threshold voltage from the threshold source multiplexor 314. The assist generator 320 generates a VDD hardware (HW) dynamic assist 332 signal that enables or disables dynamic assist control based on the comparison. The assist generator 320 transmits the VDD HW dynamic assist 332 signal to a dynamic assist multiplexor 326. If the dynamic mode 318 control signal is not asserted, then the assist generator 320 is not operating with dynamic assist control. In such cases, the assist generator 320 generates a constant value and transmits the constant value to the dynamic assist multiplexor 326.

If the assist generator 320 is operating in dynamic mode, then the mode select 324 selects the input of the dynamic assist multiplexor 326 corresponding to the VDD HW dynamic assist 332 signal from the assist generator 320. If the assist generator 320 generator is not operating in dynamic mode, then the mode select 324 selects input of the dynamic assist multiplexor 326 corresponding to the static mode 328 signal. The static mode 328 signal statically enables or disables assist control based on the state of the static mode 328 signal. The dynamic assist multiplexor 326 transmits the selected signal as the VDD dynamic assist 334 signal.

In operation, the clock gating handshake 330 receives the VDD dynamic assist 334 signal from the dynamic assist multiplexor 326. From this input, the clock gating handshake 330 generates an assist clock ungate 336 signal that temporarily suspends idle mode, such as clock gating mode, during the period of time with the dynamic assist control is toggling. As a result, the change of state of the dynamic assist control is propagated to the SRAM memory devices that are in idle mode.

In some examples, the SRAM memory devices may continue to receive memory clock signals, even when logic clock signals transmitted to logic (non-memory) devices are gated. In such examples, the clock gating handshake 330 is not needed, since the memory devices are not clock gated, even though logic devices are clock gated. In some examples, the memory clock signals transmitted to the memory devices cannot immediately be ungated, such as can occur when switching between clock signal sources. In such examples, clock ungating requests are delayed until the clock signal can be safely ungated, such as when the switch between clock signal sources is complete. In some examples, memory clock signals are paused during updates of the dynamic assist threshold value(s), such that the updated dynamic assist threshold value(s) can stabilize at the memory devices without needing to synchronize to the memory clock signals.

Figure 4:
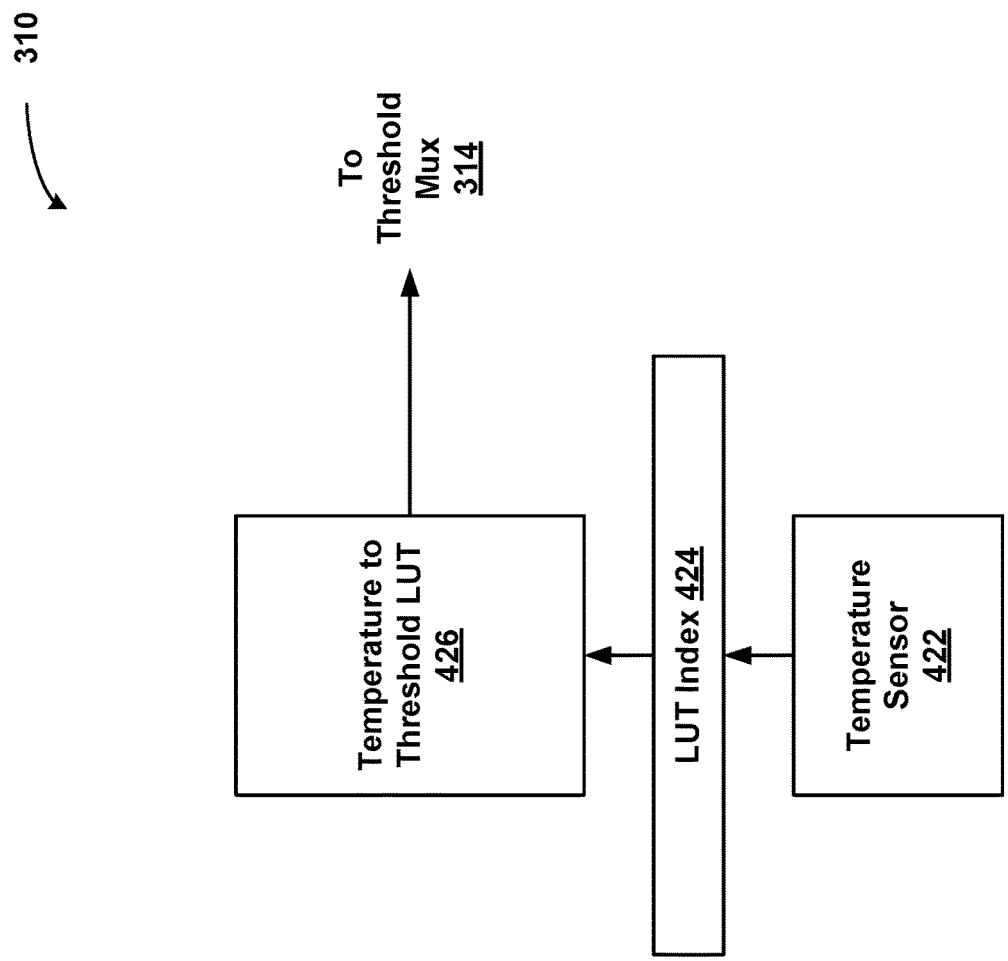
FIG. 4 is a more detailed block diagram of the secure temperature LUT of the dynamic assist control system of FIG. 3, according to various embodiments.

FIG. 4 is a more detailed block diagram of the secure temperature LUT 310 of the dynamic assist control system 300 of FIG. 3, according to various embodiments. As shown, the secure temperature LUT 310 includes, without limitation, a temperature sensor 422, a LUT index 424 register, and a temperature to threshold LUT 426. The temperature sensor 422, LUT index 424 register, and temperature to threshold LUT 426 are located in a secure portion of the system and are accessible only by a secure processor. As a result, untrusted software applications executing on an unsecure processor cannot maliciously or unintentionally access or update data stored in the temperature sensor 422, LUT index 424 register, and temperature to threshold LUT 426.

In operation, the temperature sensor 422 determines the operating temperature of the system and converts the operating temperature to a digital value. The temperature sensor 422 transmits the digital value representing the operating temperature to the LUT index 424 register. The LUT index 424 register converts the digital value representing the operating temperature to an index that addresses a memory location in the temperature to threshold LUT 426. The LUT index 424 register transmits the index to the temperature to threshold LUT 426. The temperature to threshold LUT 426 accesses the memory location indicated by the index to retrieve the digital value corresponding to the threshold voltage. The temperature to threshold LUT 426 transmits the digital value corresponding to the threshold voltage to the threshold source multiplexor 314 of FIG. 3.

In some examples, the index generated by the LUT index 424 register represents the operating temperature to the nearest five degrees Celsius. In such examples, each digital value stored in the temperature to threshold LUT 426 represents a threshold voltage that spans five degrees Celsius. As a result, a change in operating temperature of at least five degrees Celsius generates a resulting change in the threshold voltage.

In some examples, the temperature to threshold LUT 426 includes two lookup tables, a first lookup table that is accessed when the operating voltage is decreasing and a second lookup table that is accessed when the operating voltage is increasing. For a given temperature, the corresponding threshold voltage when the operating voltage is decreasing is slightly lower than the corresponding threshold voltage when the operating voltage is increasing. This difference provides hysteresis that avoids rapid toggling of the dynamic assist control between the enable and disable states when the operating voltage is near the threshold voltage.

Figure 5:
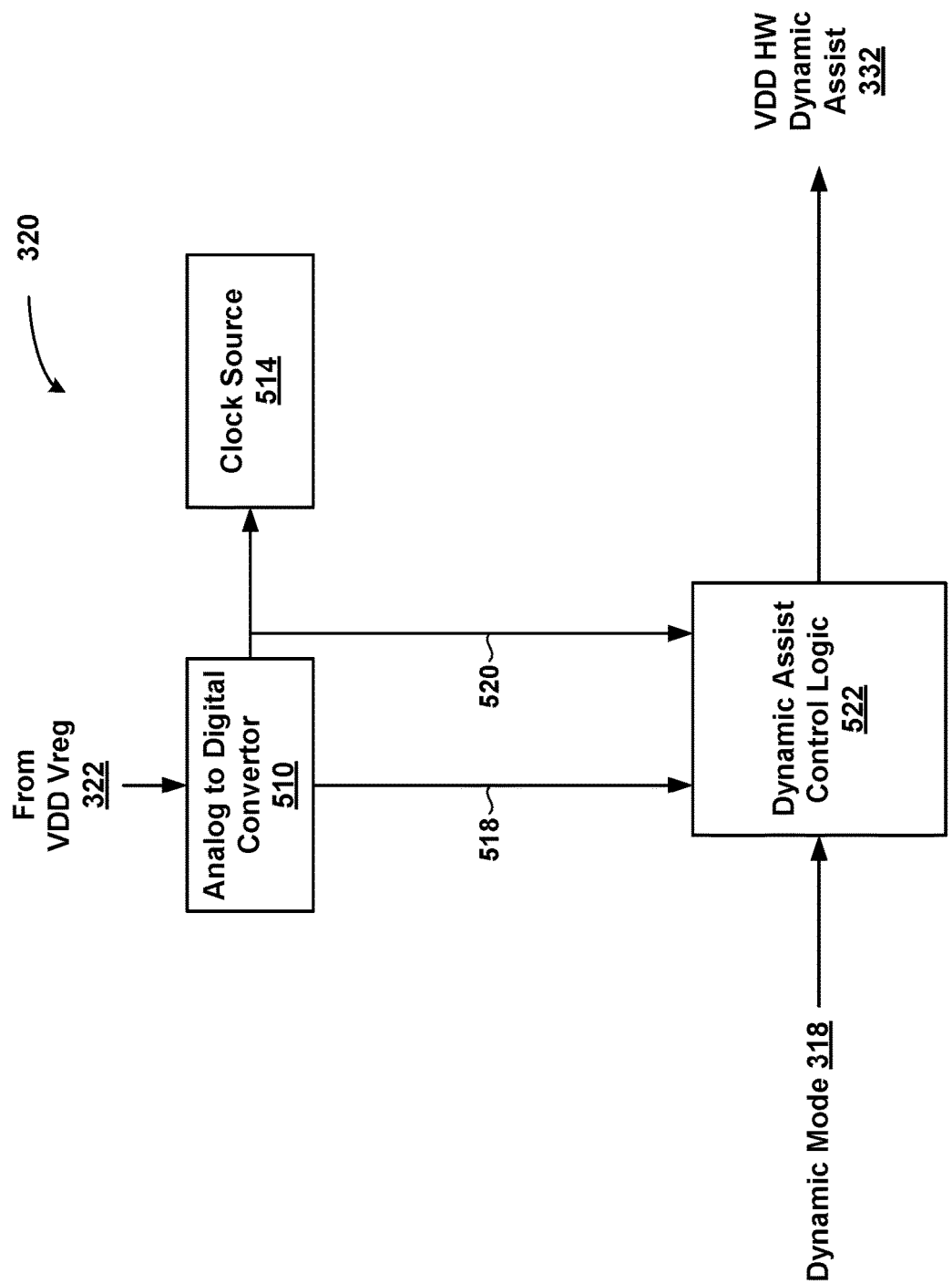
FIG. 5 is a more detailed block diagram of the assist generator of the dynamic assist control system of FIG. 3, according to various embodiments.

FIG. 5 is a more detailed block diagram of the assist generator 320 of the dynamic assist control system 300 of FIG. 3, according to various embodiments. As shown, the assist generator 320 includes an analog to digital (ADC) convertor 510, a clock source 514, and dynamic assist logic 522. The ADC convertor 510 senses the analog operating voltage from the VDD voltage regulator (Vreg) 322. The ADC convertor 510 converts the analog operating voltage into a digital value representing the calibrated operating voltage. The ADC convertor 510 transmits the digital value as an ADC data signal 520 to the dynamic assist logic 522 and to the clock source 514. The ADC convertor 510 further generates an ADC valid signal 518 that is asserted when the ADC data signal 520, the digital value representing the calibrated operating voltage, is valid. The ADC convertor 510 transmits the ADC valid signal 518 to the dynamic assist logic 522. The clock source 514 generates a clock signal based on the digital value from the ADC convertor 510 and a VF curve that is selected based on whether dynamic assist control is enabled or disabled.

The dynamic assist logic 522 receives the ADC valid signal 518 and the ADC data signal 520 from the ADC convertor 510. The dynamic assist logic 522 further receives a dynamic mode 318 signal. If the dynamic mode 318 signal is asserted, then the dynamic assist logic 522 is enabled. If the dynamic assist logic 522 is enabled, then, based on the ADC valid signal 518 and the ADC data signal 520, the dynamic assist control logic 522 generates the VDD HW dynamic assist signal 332. The dynamic assist control logic 522 employs a hysteresis comparator to generate the VDD HW dynamic assist signal 332 for distribution to various SRAM memory devices located in different regions of the system. The hysteresis comparator in the assist generator 320 asserts the VDD HW dynamic assist signal 332 when the operating voltage falls below a low threshold value. The hysteresis comparator in the assist generator 320 deasserts the VDD HW dynamic assist signal 332 when the operating voltage rises above a high threshold value. The dynamic assist control logic 522 further coordinates with the clock gating handshake 330 to sequence clock gating and certain other idle power modes. This coordination facilitates propagation of the VDD HW dynamic assist signal 332 to SRAM memory devices that are in an idle state at the time that the VDD HW dynamic assist signal 332 is toggling. The dynamic assist control logic 522 transmits the VDD HW dynamic assist signal 332 to the dynamic assist multiplexor 326 and the clock gating handshake 330.

Figure 6:
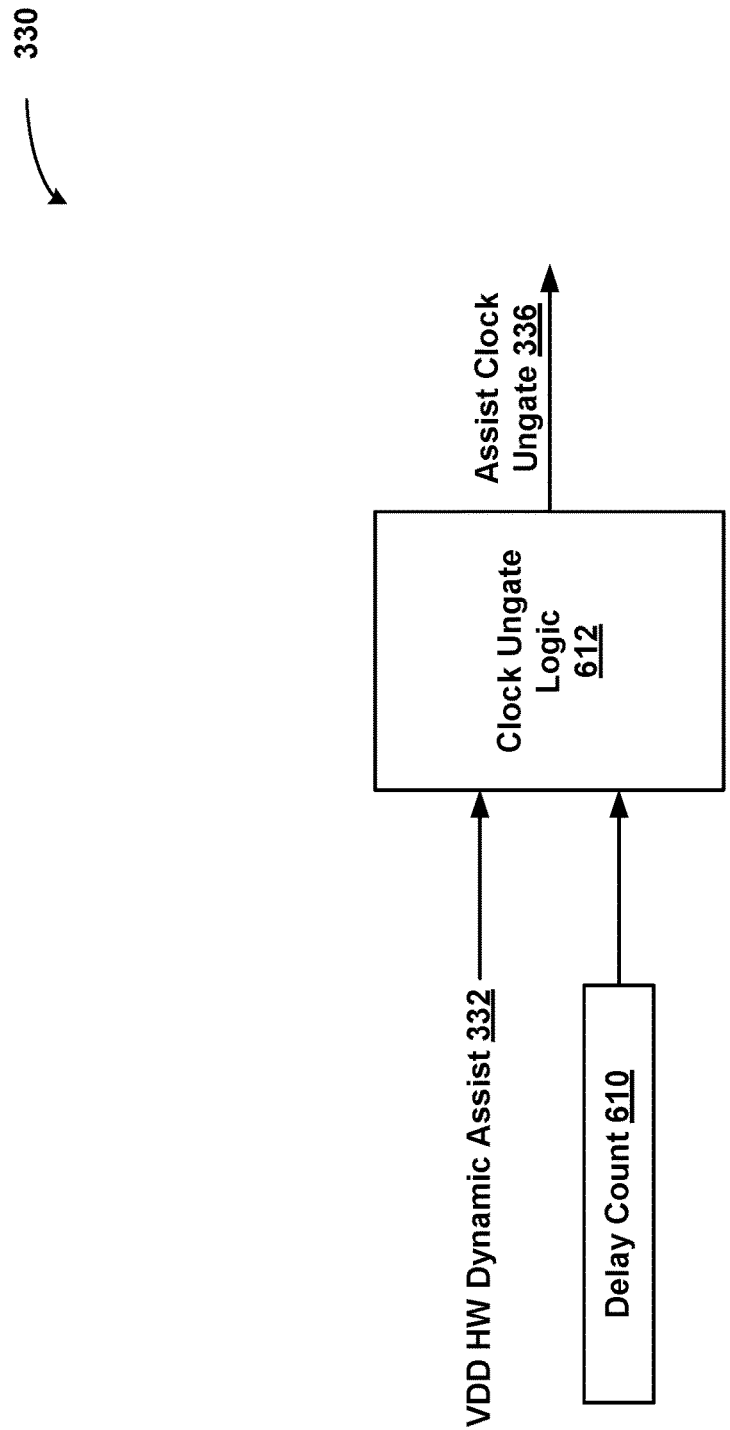
FIG. 6 is a more detailed block diagram of the clock gating handshake of the dynamic assist control system of FIG. 3, according to various embodiments.

FIG. 6 is a more detailed block diagram of the clock gating handshake 330 of the dynamic assist control system 300 of FIG. 3, according to various embodiments. As shown, the clock gating handshake 330 includes, without limitation, clock ungate logic 612. The clock ungate logic 612 receives the VDD HW dynamic assist signal 332 from the assist generator 320. The assist generator 320 asserts the VDD HW dynamic assist signal 332 when the operating voltage falls below a low threshold value. The assist generator 320 deasserts the VDD HW dynamic assist signal 332 when the operating voltage rises above a high threshold value. When the clock ungate logic 612 detects that the VDD HW dynamic assist signal 332 is asserted, the clock ungate logic 612 generates an assist clock ungate 336 signal in the form of a pulse. The pulse of the assist clock ungate 336 signal begins when the VDD HW dynamic assist signal 332 is asserted and has a pulse width based on the value in the delay count 610 register. The value in the delay count 610 register is based on the longest delay path between the assist generator 320 that generates the VDD dynamic assist signal 332 and any SRAM memory device that receives the VDD HW dynamic assist signal 332.

Upon detecting the VDD HW dynamic assist signal 332, the clock ungate logic 612 asserts the assist clock ungate 336 signal and retrieves the value in the delay count 610 register. The clock ungate logic 612 counts down starting at the value in the delay count 610 register and until the count reaches 0. As the count transitions from 1 to 0, the clock ungate logic 612 deasserts the assist clock ungate 336 signal. The clock ungate logic 612 transmits the assist clock ungate 336 signal to various SRAM memory devices located in different regions of the system. The SRAM memory devices that are in an idle mode, such as clock gating, temporarily exit from the idle mode for the duration of as assist clock ungate 336 signal. Because the duration of the assist clock ungate 336 signal is based on the longest transmission path of the VDD HW dynamic assist signal 332, various SRAM devices located in different regions of the system that were previously in an idle mode receive the VDD HW dynamic assist signal 332. When the clock ungate logic 612 deasserts the assist clock ungate 336 signal, the SRAM memory devices that exited idle mode to receive the VDD HW dynamic assist signal 332 return to the idle mode.

Figure 7:
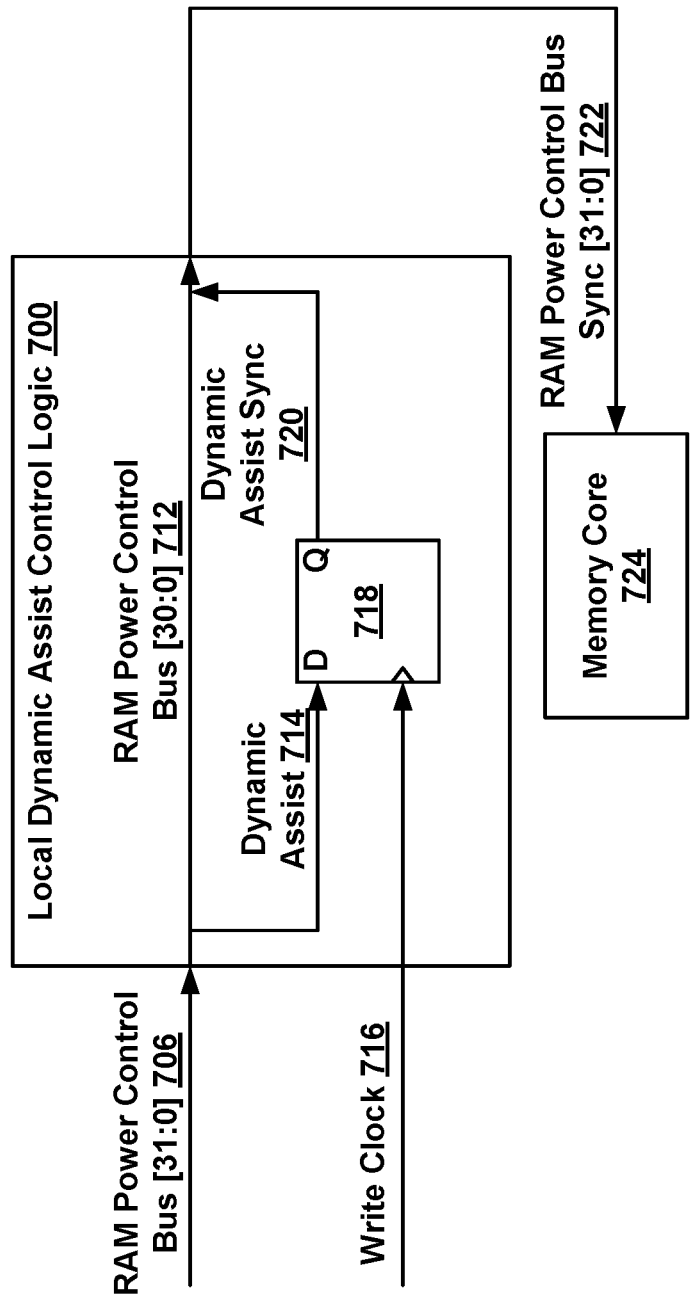
FIG. 7 is a block diagram of local dynamic assist control logic for the computer system of FIG. 1, according to various embodiments.

FIG. 7 is a block diagram of local dynamic assist control logic 700 for the computer system 100 of FIG. 1, according to various embodiments. As shown, the local dynamic assist control logic 700 includes, without limitation, a D flip-flop 718. In general, the system includes one instance of the local dynamic assist control logic 700 for each write clock domain.

The local dynamic assist control logic 700 receives 32 bits of RAM power control bus [31:0] 706. The 32 bits included in the RAM power control bus [31:0] 706 facilitate a number of power-related functions associated with the SRAM memory devices, such as clock gating, power gating, dynamic assist control, and/or the like. As shown, the local dynamic assist control logic 700 routes the lower 31 bits of the RAM power control bus [30:0] 712 of the power bus RAM data through the local dynamic assist control logic 700 without further processing. These lower 31 bits of the RAM power control bus [30:0] 712 facilitate various power bus functions other than dynamic assist control. The local dynamic assist control logic 700 synchronizes the dynamic assist input to the SRAM memory devices in order to meet setup time and hold time with respect to the write clock 716. In that regard, the remaining bit of the RAM power control bus is routed to the D input of the D flip-flop 718 as the dynamic assist 714 bit. The D flip-flop 718 is representative of any technically feasible approach for synchronizing a signal, including a single D flip-flop as shown, a circuit with multiple D flip-flop stages, a first-in-first-out (FIFO) memory device, and/or the like. Because the path from the assist generator 320 to the various SRAM devices may be different for the various clock domains, the dynamic assist 714 bit is synchronized to the write clock 716 for the clock domain that is local to the particular local dynamic assist control logic 700. This synchronization is accomplished by routing the write clock 716 to the clock input of the D flip-flop 718. As a result, the Q output of the D flip-flop 718 is a copy of the dynamic assist 714 bit that has been synchronized to the write clock 716. This synchronized copy of the dynamic assist 714 bit is shown as the dynamic assist sync 720 bit. The dynamic assist sync 720 bit is merged as bit of the RAM power control bus with the lower 31 bits of the RAM power control bus [30:0] 712 to generate a 32-bit RAM power control bus sync [31:0] 722. The RAM power control bus sync [31:0] 722 is transmitted to the memory core 724 that includes the SRAM memory devices for the clock domain.

In some examples, certain features of the SRAM memory devices that are voltage and/or temperature dependent can be dynamically changed during operation. In general, operating specifications, including setup times, hold times, propagation delays, and/or the like, are subject to change as the operating voltage and/or operating temperature changes over time. In a particular example, the amount of delay needed for a particular signal can change based on whether the operating voltage is above or below various threshold levels. Similarly, the amount of delay needed for a particular signal can change based on whether the operating temperature is above or below various threshold levels. In response, the number of delay cells and/or the amount of delay for one or more delay cells for the particular signal can dynamically change as the operating voltage and/or the operating temperature changes. Individual delay cells can be adjusted, enabled, and/or disabled to change the delay for the particular signal in response to changes in the operating voltage and/or the operating temperature. In some examples, one or more delay cells for the particular signal can be enabled and/or adjusted to increase delay when the operating voltage and/or the operating temperature exceeds a threshold value. Similarly, one or more delay cells for the particular signal can be disabled and/or adjusted to decrease delay when the operating voltage and/or the operating temperature does not exceed a threshold value. In this manner, the delay for a particular signal can be dynamically adjusted for the operating voltage and/or the operating temperature in order to improve the speed of write access operations and/or read access operations at various operating voltages and/or operating temperatures.

Figure 8:
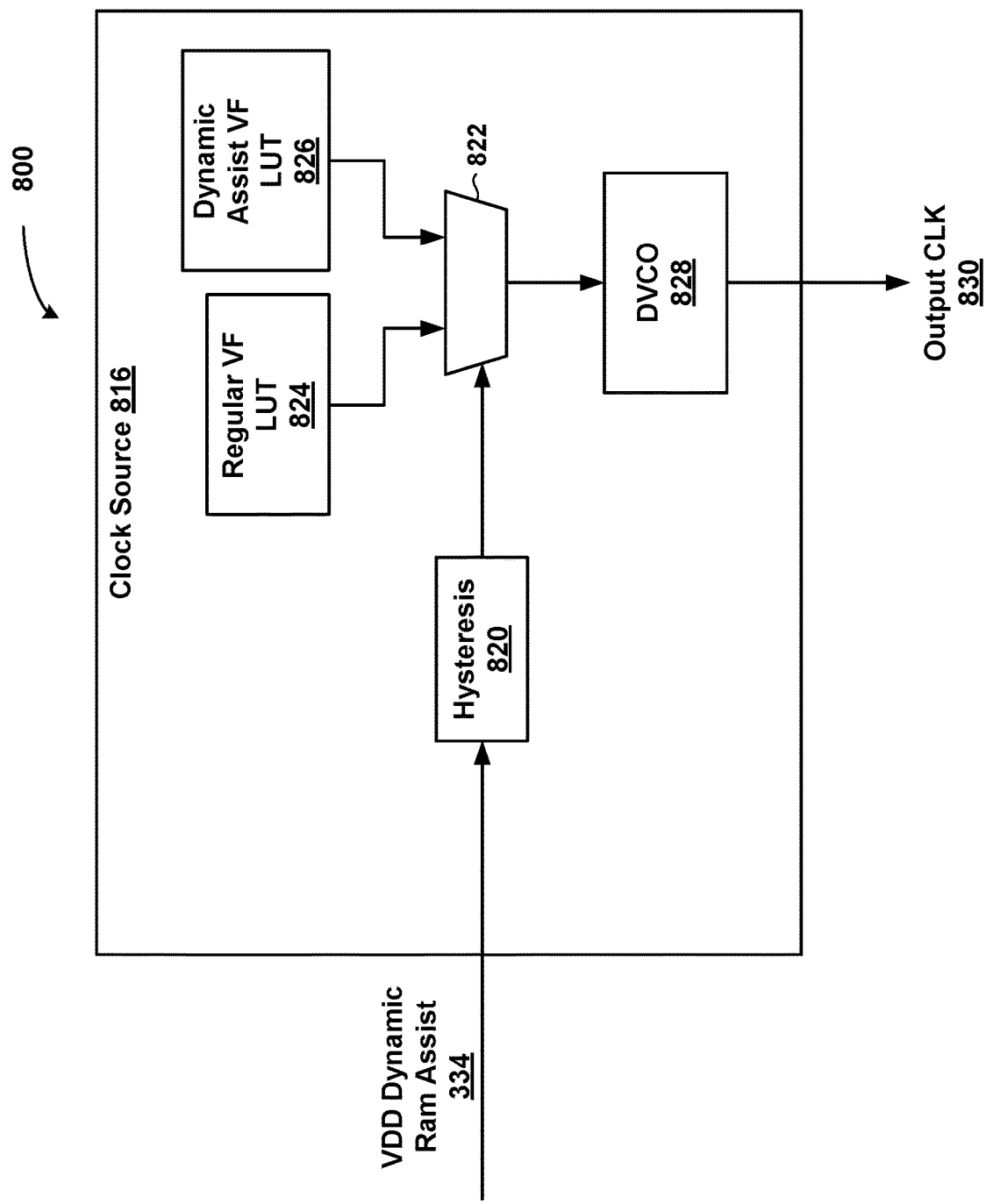
FIG. 8 is a block diagram of a clock source fast slowdown mechanism for dynamic assist control for the computer system of FIG. 1, according to various embodiments.

FIG. 8 is a block diagram of a clock source fast slowdown mechanism 800 for dynamic assist control for the computer system 100 of FIG. 1, according to various embodiments. As shown, the clock source fast slowdown mechanism 800 includes, without limitation, a clock source 816. The clock source 816 may be implemented with a noise-aware frequency locked loop (NAFLL), a phase-locked loop (PLL), and/or the like. The clock source 816 receives the VDD HW dynamic assist 332 signal from the assist generator 320. The VDD HW dynamic assist 332 signal indicates whether dynamic assist control is enabled or disabled. The clock source 816 applies hysteresis 820 to the incoming VDD HW dynamic assist 332 signal and transmits an output to the selector input of a multiplexor 822. When the operating voltage rises above the high critical voltage, the hysteresis 820 transmits a signal to the multiplexor 822 to select and/or switch to the regular VF curve lookup table (LUT) 824. When the operating voltage decreases below the low critical voltage, the hysteresis 820 transmits a signal to the multiplexor 822 to select the dynamic assist VF curve LUT 826. The multiplexor 822 transmits value from the selected LUT to a digital voltage-controlled oscillator (DVCO) 828. The DVCO 828 converts the value from the selected LUT to an output clock 830 and, in turn, drives the output clock 830 for the system. By providing a mechanism to rapidly switch between the regular VF curve LUT 824 and the dynamic assist VF curve LUT 826, the clock source 816 is able to more quickly switch between, and lock to, the VF curve for regular operation and the VF curve for dynamic assist operation. Further, the hysteresis 820 avoids rapid toggling of the clock source 816 states when the operating voltage is near the threshold voltage.

It will be appreciated that the core architecture described herein is illustrative and that variations and modifications are possible. Among other things, the techniques are described herein in the context of certain idle modes, such as clock gating. However, the techniques may be employed with other power reducing modes such as rail gating, power gating, and/or the like. When employed with these power reducing modes, temporarily exiting from the power reducing mode to propagate a change in the VDD HW dynamic assist 332 signal may be undesirable. In such cases, the change in the VDD HW dynamic assist 332 signal may be stored until a later time when the affected devices exit the power reducing mode. At that time, the stored change of the VDD HW dynamic assist 332 signal is propagated to devices exiting the power reducing mode before the devices begin operating and resume write access operations and/or read access operations.

In some examples, the system may include multiple instances of the dynamic assist control system 300 for dynamic assist control shown in FIGS. 3-6. If the system includes cold spots where the operating temperature is relatively low and/or hot spots where the operating temperature is relatively high, then multiple instances of the dynamic assist control system 300 may be warranted to provide increased granularity and performance of dynamic assist control based on the temperature differences in different parts of the system. Similarly, the system may include multiple voltage rails. In such cases, multiple instances of the dynamic assist control system 300 may be warranted to provide separate dynamic assist control for each relevant voltage rail.

Figure 9:
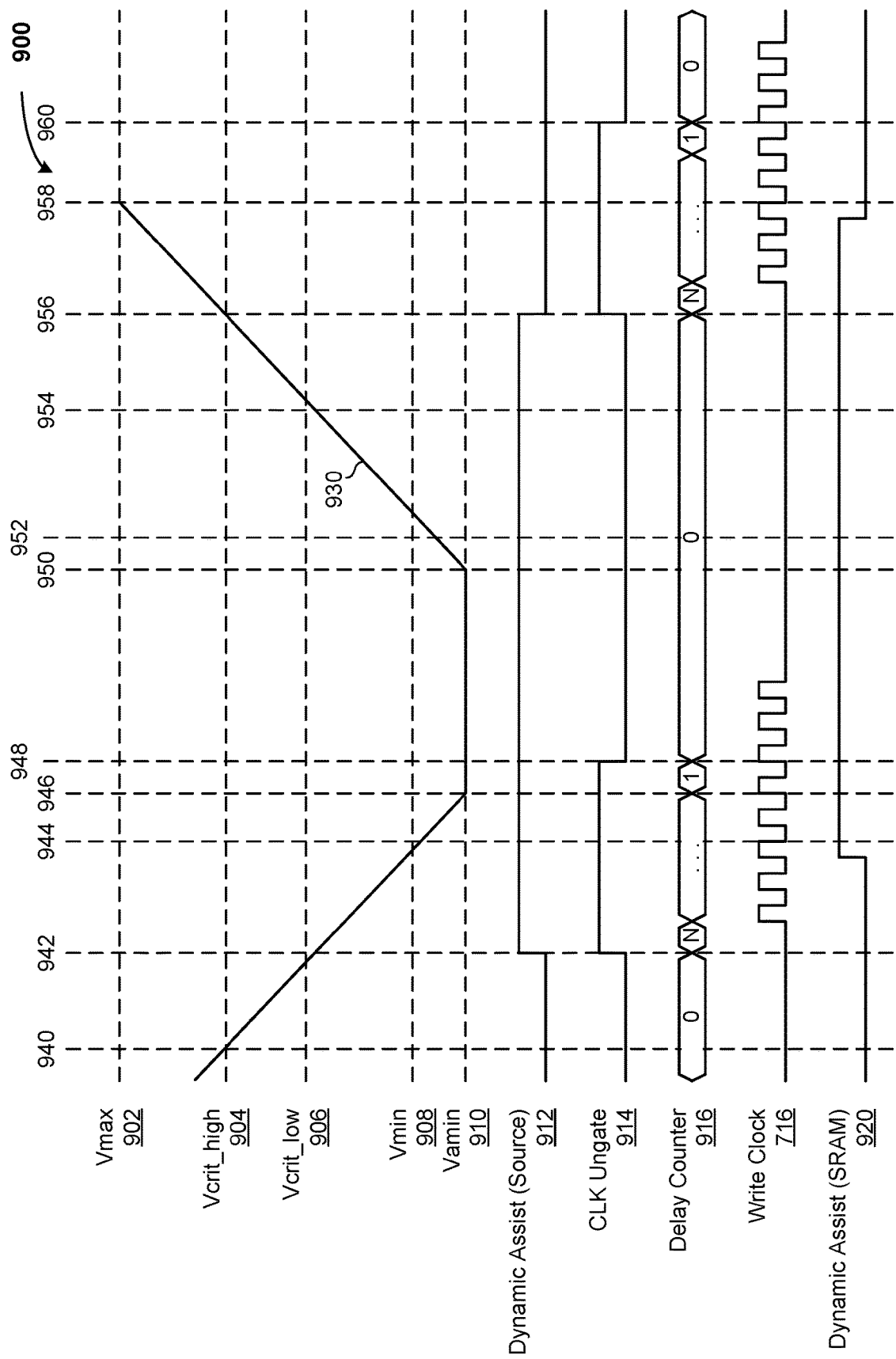
FIG. 9 is a timing diagram showing signals related to dynamic assist control for the computer system of FIG. 1, according to various embodiments.

FIG. 9 is a timing diagram 900 showing signals related to dynamic assist control for the computer system 100 of FIG. 1, according to various embodiments. As shown, at time 940, the operating voltage 930 is decreasing below the high threshold voltage Vcrit_high 904. However, due to hysteresis, no action is taken until the operating voltage 930 decreases below the low threshold voltage Vcrit_low 906 at time 942. At time 942, the assist generator 320 asserts the dynamic assist signal 912 at the signal source. The clock gating handshake 330 asserts the clock (CLK) ungate signal 914. The clock gating handshake 330 loads the delay counter 916 with the value in the delay count 610 register and begins counting the delay counter 916 down from the initial value 'N' to 0. The write clock 716 signal of FIG. 7 is activated in order to synchronize, via D flip-flop 718, the dynamic assist (SRAM) 920 signal with the clock domain local to the corresponding memory core 724. Because dynamic assist control is enabled, the operating voltage 930 is able to pass below Vmin 908 at time 944 and decrease to Vamin 910 at time 946. In the meantime, the dynamic assist signal 912 at the signal source has propagated to the SRAM memory devices, as shown for the dynamic assist signal 920 at the SRAM memory device. The dynamic assist signal 920 at the SRAM memory device becomes active sometime during the period when the CLK ungate signal 914 is asserted.

When the delay counter 916 transitions from 1 to 0, at time 948, the clock gating handshake 330 deasserts the CLK ungate signal 914. At time 950, the operating voltage begins to rise above Vamin 910 and passes through Vmin 908 at time 952. At time 954, the operating voltage 930 is increasing above the low threshold voltage Vcrit_low 906. However, due to hysteresis, no action is taken until the operating voltage 930 increases above the high threshold voltage Vcrit_high 904 at time 956. At time 956, the assist generator 320 deasserts the dynamic assist signal 912 at the signal source. The clock gating handshake 330 asserts the clock (CLK) ungate signal 914. The clock gating handshake 330 loads the delay counter 916 with the value in the delay count 610 register and begins counting the delay counter 916 down from the initial value 'N' to 0. The write clock 716 signal of FIG. 7 is activated in order to synchronize, via D flip-flop 718, the dynamic assist (SRAM) 920 signal with the clock domain local to the corresponding memory core 724. The dynamic assist signal 912 at the signal source propagates to the SRAM memory devices, as shown for the dynamic assist signal 920 at the SRAM memory device. The dynamic assist signal 920 at the SRAM memory device becomes inactive sometime during the period when the CLK ungate signal 914 is asserted. Because dynamic assist control is disabled, the operating voltage 930 is able to increase to Vmax 902 at time 958. When the delay counter 916 transitions from 1 to 0, at time 960, the clock gating handshake 330 deasserts the CLK ungate signal 914.

Figure 10:
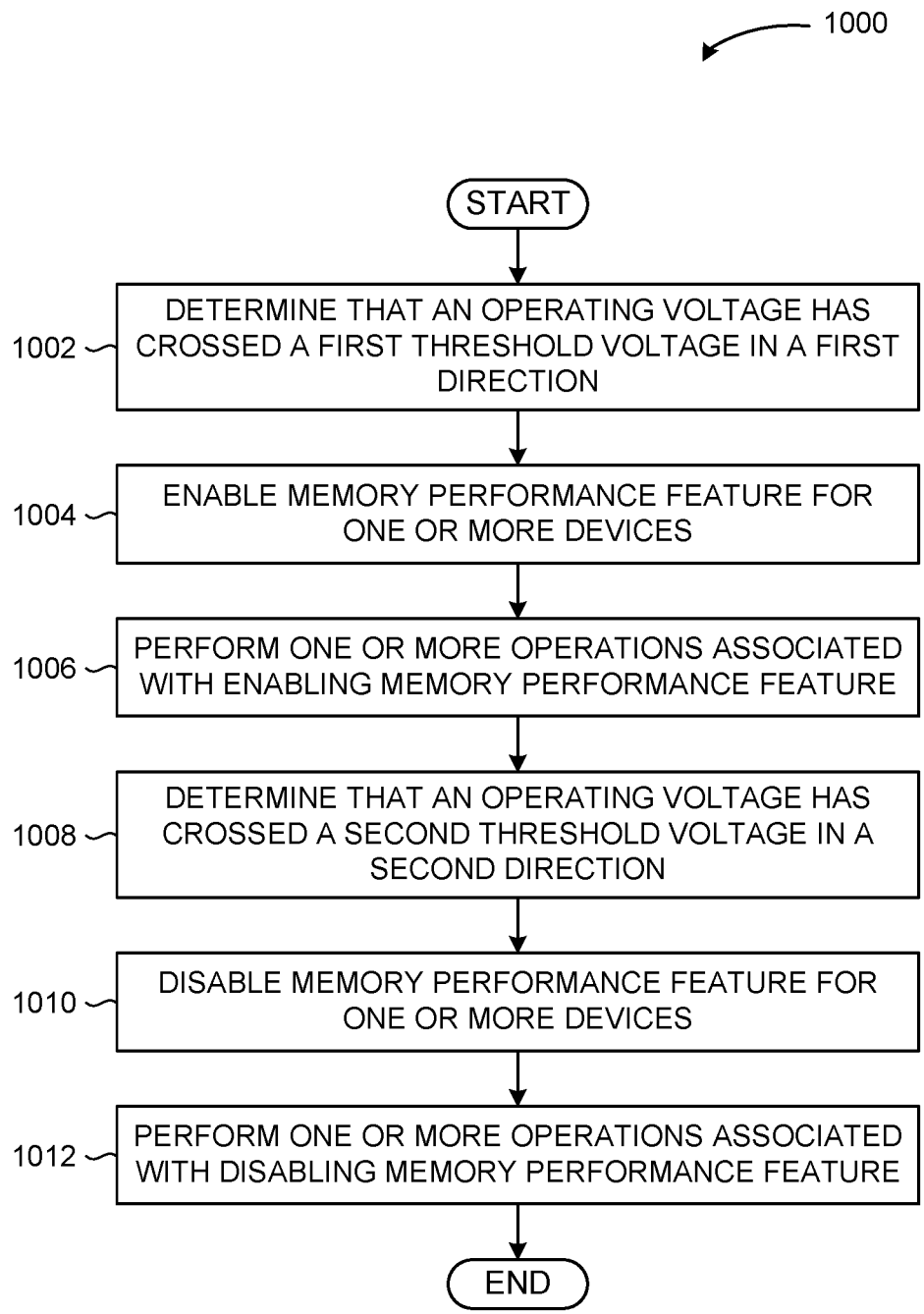
FIG. 10 is a flow diagram of method steps for controlling a memory device performance feature for the computer system of FIG. 1, according to various embodiments.

FIG. 10 is a flow diagram of method steps for controlling a memory device performance feature for the computer system 100 of FIG. 1, according to various embodiments. Although the method steps are described in conjunction with the systems of FIGS. 1-9, persons of ordinary skill in the art will understand that any system configured to perform the method steps, in any order, is within the scope of the present disclosure.

As shown, a method 1000 begins at step 1002, where a control system, such as dynamic assist control system 300, determines that an operating voltage has crossed a first threshold voltage in a first direction. In some examples, the control system determines that an operating voltage has fallen and is now below the first threshold voltage. A secure temperature LUT 310 included in a dynamic assist control system 300 generates a digital value representing a temperature variable threshold voltage, where the threshold voltage changes as the operating temperature changes. Alternatively, in applications where the threshold voltage does not change with operating temperature, the threshold voltage is retrieved from a VDD dynamic assist threshold register 316. An assist generator 320 compares the operating voltage from the VDD voltage regulator (Vreg) 322 with the digital value representing the selected threshold voltage. The assist generator 320 compares the operating voltage from the VDD voltage regulator (Vreg) 322 with the digital value representing the selected threshold voltage from the threshold source multiplexor 314 to determine when the operating voltage decreases below the low threshold voltage. Additionally or alternatively, the control system can be employed with other memory device performance features. In some examples, the control system is employed to implement a dynamic turbo mode. In such examples, the control system determines that an operating voltage has risen and is now above the first threshold voltage.

At step 1004, in response to determining that the operating voltage has crossed the first threshold voltage in the first direction, the control system enables dynamic assist control, and/or other memory performance feature, for one or more devices. The assist generator 320 asserts the dynamic assist signal and/or other memory performance feature, at the signal source.

At step 1006, the control system performs one or more operations associated with enabling dynamic assist control and/or other memory performance feature. The clock gating handshake 330 asserts a clock CLK ungate signal. The clock gating handshake 330 loads a delay counter with the value in the delay count 610 register and begins counting the delay counter down from the initial value 'N' to 0. Because dynamic assist control is enabled, the operating voltage is able to pass below Vmin and decrease to Vamin. In the meantime, the dynamic assist signal at the signal source has propagated to the SRAM memory devices, as shown for the dynamic assist signal at the SRAM memory device. The dynamic assist signal at the SRAM memory device becomes active sometime during the period when the CLK ungate signal is asserted. When the delay counter transitions from 1 to 0, the clock gating handshake 330 deasserts the CLK ungate signal.

A clock source 816 receives the VDD HW dynamic assist 332 signal from the assist generator 320. The VDD HW dynamic assist 332 signal indicates that dynamic assist control is enabled. The clock source 816 transitions from selecting and/or switching to a regular VF curve LUT 824 to select the dynamic assist VF curve LUT 826. The value from the selected LUT is transmitted to a DVCO 828 which, in turn, converts the value from the selected LUT into an output clock 830 and drives the output clock 830 for the system.

At step 1008, the control system determines that an operating voltage has crossed a second threshold voltage in a second direction. In some examples, the control system determines that an operating voltage has risen and is now above the first threshold voltage. The secure temperature LUT 310 generates a digital value representing a temperature variable threshold voltage, where the threshold voltage changes as the operating temperature changes. Alternatively, in applications where the threshold voltage does not change with operating temperature, the threshold voltage is retrieved from a VDD dynamic assist threshold register 316. An assist generator 320 compares the operating voltage from the VDD voltage regulator (Vreg) 322 with the digital value representing the selected threshold voltage. The assist generator 320 compares the operating voltage from the VDD voltage regulator (Vreg) 322 with the digital value representing the selected threshold voltage from the threshold source multiplexor 314 to determine when the operating voltage increases above the high threshold voltage. Additionally or alternatively, the control system can be employed with other memory device performance features. In some examples, the control system is employed to implement a dynamic turbo mode. In such examples, the control system determines that an operating voltage has fallen and is now below the first threshold voltage.

At step 1010, the control system, in response to determining that the operating voltage has crossed the second threshold voltage in the second direction, disables dynamic assist control for one or more devices. The assist generator 320 deasserts the dynamic assist signal at the signal source.

At step 1012, the control system performs one or more operations associated with disabling dynamic assist control and/or other memory performance feature. The operating voltage begins to rise until the operating voltage increases above the high threshold voltage Vcrit_high. The assist generator 320 deasserts the dynamic assist signal at the signal source. The clock gating handshake 330 asserts the CLK ungate signal. The clock gating handshake 330 loads the delay counter with the value in the delay count 610 register and begins counting the delay counter down from the initial value 'N' to 0. The dynamic assist signal at the signal source propagates to the SRAM memory devices, as shown for the dynamic assist signal at the SRAM memory device. The dynamic assist signal at the SRAM memory device becomes inactive sometime during the period when the CLK ungate signal is asserted. Because dynamic assist control is disabled, the operating voltage is able to increase to Vmax. When the delay counter transitions from 1 to 0, the clock gating handshake 330 deasserts the CLK ungate signal.

A clock source 816 receives the VDD HW dynamic assist 332 signal from the assist generator 320. The VDD HW dynamic assist 332 signal indicates that dynamic assist control is disabled. The clock source 816 transitions from selecting and/or switching a dynamic assist VF curve LUT 826 to select the regular VF curve LUT 824. The value from the selected LUT is transmitted to the DVCO 828 which, in turn, converts the value from the selected LUT into an output clock 830 and drives the output clock 830 for the system.

The method 1000 then terminates. Alternatively, the method 1000 returns to step 1002 to continue monitoring the operating voltage and controlling the enabling and disabling of dynamic assist control and/or other memory performance feature.

In sum, various embodiments are directed to techniques for dynamically applying assist control for an integrated circuit, such as for SRAM memory devices. With the disclosed techniques, dynamic assist control is enabled or disabled based on the operating voltage relative to a threshold voltage. If the operating voltage falls below the threshold voltage, then dynamic assist control is enabled, which reduces the minimum operating voltage (Vmin) of the integrated circuit. If the operating voltage rises above the threshold voltage, then dynamic assist control is disabled, which increases the maximum operating voltage (Vmax) of the integrated circuit. Various techniques enable dynamic assist control to be employed even with complex integrated circuits that may include tens of thousands of devices that employ dynamic assist control technology.

At least one technical advantage of the disclosed techniques relative to the prior art is that, with the disclosed techniques, SRAM memory devices have a larger operating voltage range relative to devices with static assist. By enabling dynamic assist control at lower operating voltages, Vmin is reduced, thereby decreasing the minimum power consumption. By disabling dynamic assist control at higher operating voltages, Vmax is increased, thereby increasing the maximum performance. Another technical advantage of the disclosed techniques is that the control mechanism deployed for dynamic assist control can additionally or alternatively be employed for other memory performance features, thereby enabling dynamic control for turbo mode and/or other performance features. These technical advantages represent one or more technological improvements over prior art approaches.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for controlling a memory device performance feature, the method comprising:
    selecting a first threshold voltage from among a temperature variable threshold voltage and a fixed threshold voltage;
    determining that an operating voltage received from a voltage regulator external to a memory device has crossed the first threshold voltage in a first direction;
    in response, enabling the memory device performance feature for a first memory device;
    determining that the operating voltage has crossed a second threshold voltage in a second direction; and
    in response, disabling the memory device performance feature for the first memory device.

2. The computer-implemented method of claim 1, further comprising switching a clock source from operating according to a first voltage-frequency curve to operating according to a second voltage-frequency curve.

3. The computer-implemented method of claim 1, further comprising retrieving at least one of the first threshold voltage or the second threshold voltage from a lookup table.

4. The computer-implemented method of claim 1, further comprising retrieving at least one of the first threshold voltage or the second threshold voltage from a memory with restricted access.

5. The computer-implemented method of claim 1, further comprising:
    determining an operating temperature associated with the first memory device;
    converting the operating temperature to an index; and
    retrieving at least one of the first threshold voltage or the second threshold voltage based on the index.

6. The computer-implemented method of claim 1, further comprising:
    asserting a signal to disable a clock gating mode at the first memory device;
    waiting for the signal to propagate to the first memory device; and
    deasserting the signal to enable the clock gating mode at the first memory device.

7. The computer-implemented method of claim 1, further comprising:
    transmitting a signal associated with enabling the memory device performance feature to the first memory device; and
    synchronizing the signal with a first clock signal associated with a first clock domain of the first memory device.

8. The computer-implemented method of claim 7, further comprising:
    transmitting the signal associated with enabling the memory device performance feature to a second memory device; and
    synchronizing the signal with a second clock signal associated with a second clock domain of the second memory device.

9. The computer-implemented method of claim 1, wherein a first maximum operating voltage corresponding to disabling the memory device performance feature for the first memory device is greater than a second maximum operating voltage corresponding to enabling the memory device performance feature for the first memory device.

10. The computer-implemented method of claim 1, wherein the first threshold voltage is different from the second threshold voltage.

11. A system, comprising:
    a first memory device; and
    a control system coupled to the first memory device, and that:
        selects a first threshold voltage from among a temperature variable threshold voltage and a fixed threshold voltage;
        determines that an operating voltage received from a voltage regulator external to the first memory device has crossed the first threshold voltage in a first direction;
        in response, enables a memory device performance feature for the first memory device;

determines that the operating voltage has crossed a second threshold voltage in a second direction; and in response, disables the memory device performance feature for the first memory device.

12. The system of claim 11, wherein the control system further switches a clock source from operating according to a first voltage-frequency curve to operating according to a second voltage-frequency curve.

13. The system of claim 11, wherein the control system further retrieves at least one of the first threshold voltage or the second threshold voltage from a lookup table.

14. The system of claim 11, wherein the control system further retrieves at least one of the first threshold voltage or the second threshold voltage from a memory with restricted access.

15. The system of claim 11, wherein the control system further:

determines an operating temperature associated with the first memory device;

converts the operating temperature to an index; and retrieves at least one of the first threshold voltage or the second threshold voltage based on the index.

16. The system of claim 11, wherein the control system further:

asserts a signal to disable a clock gating mode at the first memory device;

waits for the signal to propagate to the first memory device; and deasserts the signal to enable the clock gating mode at the first memory device.

17. The system of claim 11, wherein the control system further:

transmits a signal associated with enabling the memory device performance feature to the first memory device; and synchronizes the signal with a first clock signal associated with a first clock domain of the first memory device.

18. The system of claim 17, wherein the system further includes a second memory device, and where the control system further:

transmits the signal associated with enabling the memory device performance feature to the second memory device; and synchronizes the signal with a second clock signal associated with a second clock domain of the second memory device.

19. The system of claim 11, wherein a first maximum operating voltage corresponding to disabling the memory device performance feature for the first memory device is greater than a second maximum operating voltage corresponding to enabling the memory device performance feature for the first memory device.

20. The system of claim 11, wherein the first threshold voltage is different from the second threshold voltage.

* * * * *